United States Patent [19]

Pelletier

[11] 4,325,022
[45] Apr. 13, 1982

[54] CABLE SHIELD FAULT LOCATION USING A CAPACITIVE-INDUCTIVE COUPLER

[75] Inventor: James A. Pelletier, Dover, N.J.

[73] Assignee: Bell Telephone Laboratories, Incorporated, Murray Hill, N.J.

[21] Appl. No.: 104,158

[22] Filed: Dec. 17, 1979

[51] Int. Cl.³ .................................... G01R 31/11
[52] U.S. Cl. ................................. 324/52; 324/127
[58] Field of Search ............... 324/51, 52, 54, 127; 179/175.3 F

[56] References Cited

U.S. PATENT DOCUMENTS

| | | | |
|---|---|---|---|
| 2,493,800 | 1/1950 | Biskeborn | 324/52 |
| 2,769,868 | 11/1956 | Brownlow | 324/52 X |
| 2,808,566 | 10/1957 | Douma | 324/127 |
| 3,113,266 | 12/1963 | Lehman et al. | 324/52 |
| 3,211,997 | 10/1965 | Hara | 324/52 |
| 3,684,955 | 8/1972 | Adams | 324/127 X |
| 3,792,350 | 2/1974 | Bossler et al. | 324/52 |
| 3,803,484 | 4/1974 | Gray | 324/54 |
| 3,831,086 | 8/1974 | Pesto | 324/52 X |
| 3,860,866 | 1/1975 | Dornberger | 324/52 |
| 3,909,712 | 9/1975 | Rietz et al. | 324/52 |
| 4,165,482 | 8/1979 | Gale | 324/52 |

FOREIGN PATENT DOCUMENTS

| | | | |
|---|---|---|---|
| 632966 | 11/1978 | U.S.S.R. | 324/52 |
| 645101 | 1/1979 | U.S.S.R. | 324/52 |

OTHER PUBLICATIONS

Maloney, Chas., "Locating Cable Faults", *IEEE Transactions on Industry Applications*, vol. 1A-9, No. 4, Jul.-/Aug., 1973, pp. 380-394.

Primary Examiner—Gerard R. Strecker
Attorney, Agent, or Firm—R. O. Nimtz

[57] ABSTRACT

Apparatus, and associated methodology, for testing shielded, multipair cables to detect shield and bonding faults comprises: means (20) for inductively coupling excitation source (10) to pair grouping (16); and means (50) for capacitively coupling grouping (16) to detect excitation source (10) and the signal reflected from the faults and to provide the detected signals to detector (70), which is interposed between shield (15) and capacitive means (50). Detector (70) provides fault location capability by indicating the time difference between preselected characteristics of the source and correspondingly selected characteristics of the reflected signal.

3 Claims, 4 Drawing Figures

CABLE SHIELD FAULT LOCATION USING A CAPACITIVE-INDUCTIVE COUPLER

BACKGROUND OF THE INVENTION

1. Field of the Invention

This invention relates generally to testing for faults in cables and, more particularly, to apparatus and associated methodology for detecting and locating opens in cable shields or shield bonds.

2. Description of the Prior Art

Multipair, shielded cable is presently the predominant transmission medium utilized in the outside plant portion of a telephone system, that is, the portion serving to interconnect a central office with customer equipment. Continuity of the shield surrounding the multiple pairs composing a cable is important, particularly in the outside plant environment, for several reasons. First, from the viewpoint of safety to the customer or cable forces, a continuous shield provides a low resistance path to ground for lightning and power fault currents. Second, shield continuity reduces alternating current inductive interference. Poor cable shielding, caused in part by broken jumpers or bonds that bridge together contiguous segments of cable, allows unwanted signals to electromagnetically couple to the individual cable pairs and generate interference. Transmission quality is directly related to the effectiveness of shielding and noise mitigation requires a continuous shield.

Detecting and then locating shield faults occurring along a cable route can be difficult, time-consuming and expensive, especially if the facilities are buried or underground. To underscore the magnitude of the problem, the growth of buried plant over the past ten years has been three-fold; this growth emphasizes the need for equipment and a methodology capable of effectively locating shield faults such as open bonds. Since it is also well-known that defective bonds occur in significant numbers in both aboveground and cross-connect pedestals as well as in buried or underground sections, any newly devised technique must be quite versatile in capability.

To detect and locate open bonds in cables, various techniques and equipment are used that achieve varying degrees of success. Each method, however, has at least one major shortcoming.

U.S. Pat. No. 3,792,350, issued to F. C. Bossler et al, is representative of prior art techniques and devices categorized as tone tracers. The testing arrangement of Bossler et al employs: a signal source connected between shield and ground at an appropriate access point along the cable; and a portable probe to measure electromagnetic field components in two transverse directions at ground level near the anticipated fault. Certain preparatory steps are required in order to mitigate distortion of the field components; these steps include grounding the shield on the side of the open opposite the source and removing all other grounds. This latter step is unduly burdensome in many applications wherein multiple grounds are utilized to reduce inductive interference.

Other types of tone tracers can function as open bond locators if the bond is also faulted to ground with a resistance of approximately 500,000 ohms or less and no connections to power neutral are present.

Many of the limitations faced by these tracer methods are not applicable to approaches employing time domain reflectometry (TDR) techniques; however, conventional TDR also has deficiencies. An improved TDR methodology and associated apparatus, which are the subject matter of this inventio, mitigate these deficiencies.

Representative of prior art TDR approaches is an overview article entitled "Locating Cable Faults," by C. A. Maloney, published in the *IEEE Transactions on Industrial Applications*, July/August, 1973. The portion on pages 387 and 388 relating to "pulse reflection" is basically the conventional TDR approach. Time domain reflectometers differ from tracer sets and the like in that they operate in the time domain and provide the electrical distance to the fault as the result of measuring a pulse reflected from the fault. Reflectometers utilize the principle that a cable fault involves an impedance discontinuity characterized by a reflection parameter, so that a portion of an incident signal is reflected and returned to the source. The voltage returned is a function of the incident voltage weighted by the reflection parameter.

Reflectometers have been used to detect and locate conductor faults like opens, shorts and crosses as well as water and load coils. However, as open bond locators, conventional reflectometers have achieved limited success. A major part of the problem involves the TDR fault circuit configuration. One conventional use of the reflectometer as an open bond locator is to connect the instrument between the shield and ground at an access point. This shield-ground circuit may have severe distance limitations in many applications, particularly those involving multiple connections to power neutral. These multiple connections provide a low impedance path to ground resulting in high signal attenuation.

This problem may be alleviated by utilizing a shield-pair circuit to launch the incident voltage. This configuration does not have the attenuation problems associated with the shield-ground circuit. However, variations in the separation between the pair and the shield cause impedance fluctuations that produce random waviness, which appears as base-line clutter on a visual display of incident and reflected voltages. Although clutter decreases with distance, the interpretation of a returned voltage that falls within the clutter is difficult. In addition, dispersion, the unequal attenuation of pulse frequency components, can contribute to the already difficult task of fault identification by transforming the transmitted signal, usually a pulse, from a readily recognizable shape to a smeared, distorted shape which is not easily recognized.

SUMMARY OF THE INVENTION

These deficiencies, shortcomings and limitations in the prior art are mitigated in accordance with the present invention by improved time domain reflectometry apparatus particularly adapted to test for open bonds. The apparatus utilizes a group or bundle of pairs to support signal propagation as well as to provide reduced clutter by averaging of random parameter variations between pairs. The apparatus comprises: means, inductively coupled to the pair group, for transmitting a time-limited signal excitation; and means, capacitively coupled to the group of pairs, for detecting both the excitation and the signal returned from a faulty bond or shield. The time domain testing arrangement is based on the recognition that: (i) inductive coupling to the group of pairs in an equivalent two-wire circuit having the group as one wire and the shield as the other provides efficient propagation of the signal source; and (ii) capacitive coupling to the same group effects a low-loss, matched detector for both the source and returned signals. Moreover, because individual pairs exhibit impedance fluctuations due to variations in separations between any pair and the shield, the arrangement averages fluctuations to yield a concomitant increase in signal-to-noise ratio.

A feature of this capacitive-inductive coupling arrangement is the decoupling of the mode of transmission from the mode of reception. The fundamental TDR approach and conventional variations thereon employ a direct connection to an equivalent two-wire line. Because of the unusual characteristics exhibited by the shield-bundle two-wire line, the more advantageous transmit and receive connections disclosed by the present invention are necessitated. Furthermore, because no direct connections to the pairs are required, the arrangement may be utilized on pairs that are working or in service.

Other features, objects and advantages of the present invention will be apparent hereinafter from a detailed description of the invention and the appended claims taken in conjunction with the attached drawing of an illustrative embodiment.

DETAILED DESCRIPTION

Figure 1:
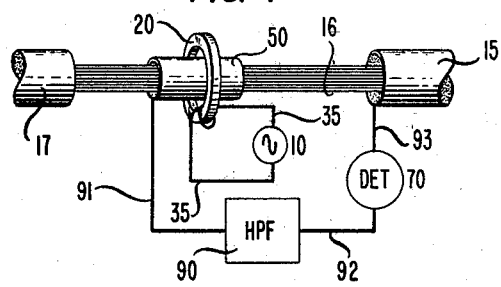
FIG. 1 is a diagram, partly in schematic form and partially in pictorial form, depicting the capacitive-inductive coupler arrangement in accordance with the present invention.

FIG. 1 is a diagram, partly in schematic form and partially in pictorial form, displaying the capacitive-inductive coupler arrangement. The structure and operation of the coupler of FIG. 1 are provided by the discussion that follows. Attention is first focused on inductive coupler 20.

It is well-known that an alternating signal source or pulse can be coupled into a wire using a toroidal coil. Ideally, the signal or pulse should be introduced uniformly into all pairs for maximum averaging of variations between pairs. However, the frequency required to produce uniform axial current density in the group of pairs is generally quite low, on the order of 10 Hz, because of skin effect. Since the resolution of a reflectometer depends on the rise time of the excitation signal, a 10 Hz pulse would result in unacceptable resolution. A compromise is to use a signal of typically 0.5 to 50 MHz frequency content to achieve acceptable resolution. The axial current density is now nonuniform since a fast pulse would couple primarily into the outer pairs of a group. However, even though outer conductors support propagation, a sufficiently large grouping of pairs, typically 25, provides acceptable averaging so as to enhance the signal-to-noise ratio and reduce base-line clutter.

Figure 2:
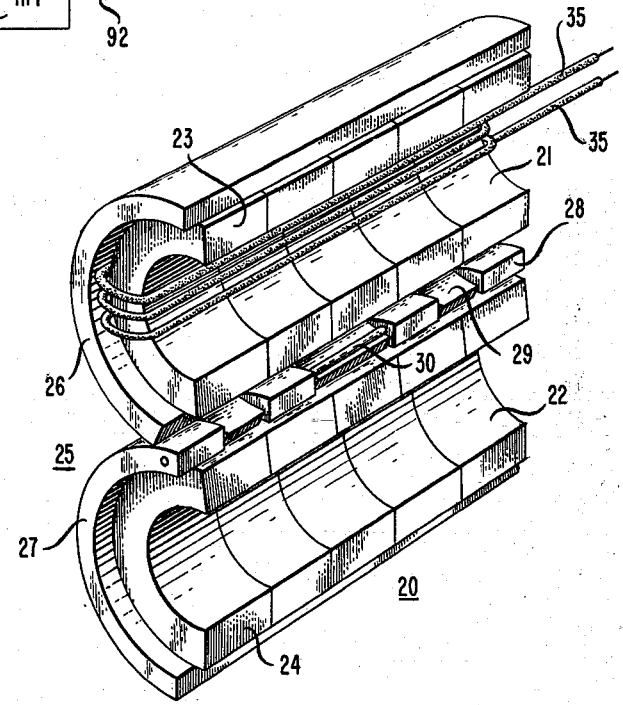
FIG. 2 depicts an illustrative embodiment of inductive coupler 20 of FIG. 1.

FIG. 2 depicts an illustrative embodiment of inductive coupler 20 utilized, referring now to FIG. 1, in propagating excitation source 10 along the grouping of pairs 16. With reference to FIG. 2, coupler 20 comprises upper and lower ferrite cores 21 and 22, respectively, mounted on hinged, cylindrical holder 25. Cores 21 and 22 are semicircularly-shaped when viewed along the axial direction of holder 25; moreover, when upper faces 23 and lower faces 24 of cores 21 and 22, respectively, are brought into contact by operation of holder 25, cores 21 and 22 combine to form a circular enclosure about pairs 16. In the illustrative embodiment, five cores 21 are arranged in side-by-side fashion and three turns of wire 35 encompass all cores 21 at about the midpoint of their semicircular arc so that turns 35 are substantially parallel with pairs 16. Turns 35 form the primary of a transformer and are connected to source 10 (see FIG. 1). The inner diameter of cores 21 and 22 is sufficient to enclose the anticipated grouping size, typically 25 or 50 pairs, utilized with coupler 20.

Cylindrical holder 25 comprises upper and lower shells 26 and 27, respectively, also semicircularly-shaped to seat cores 21 and 22. The inner diameter of each shell 26 or 27 conforms to the outer diameter of core 21 or 22, each of which is mounted in shell 26 or shell 27 via a suitable attaching means, such as adhesive or fasteners. The axial length of shells 26 and 27 is sufficient to mount the side-by-side placement of the two rows of cores.

The top edge of shell 27 is partially cut away to form lower hinge fingers 28. Similarly, the bottom edge of shell 26 is cut away to form upper hinge fingers 29 which fit between lower fingers 28. Hinges 28 and 29 thereby cooperatively mate to receive hinge bar 30, which is axially aligned with holder 25 and which seats in aligned holes in the side walls of fingers 28 and 29. The folding and unfolding capability of holder 25 effects the mechanical requirement of circumscribing the group of pairs 16 and the electrical requirement of providing a substantially continuous magnetic path about the grouping of pairs 16.

Whereas a toroidal core is efficient in injecting a pulse into a cable, a core is not efficient in extracting a returned pulse. This is primarily due to the small incremental permeability of the core for small magnetic fields. Capacitive couplers, on the other hand, present the dual effect in that they are inefficient in injecting pulses but are well-matched to the transmission medium in the detection mode. These effects inure because, in the transmit mode, high impedance presented by leads connecting the capacitive coupler to the source, as well as high impedance between the coupler and the cable, severely attenuates the signal. However, in the receive mode, the energy stored in the capacitance of the cable pairs becomes the current source and only about half the return signal is attenuated by the capacitive coupler-to-cable path.

As depicted in FIG. 1, capacitive coupler 50 surrounds cable pairs 16 in a manner similar to inductive coupler 20. Coupler 50 may take the same form as hinged holder 25 and is constructed from a nonferrous metal such as aluminum. Both couplers 20 and 50 are coaxial, coupler 50 being nearest pairs 16.

Coupler 50 is connected via lead 91 to high-pass filter 90 which reduces potential low frequency interference from in-service pairs. Detector 70 is connected between cable shield 15 via lead 93 and filter 90 via lead 92. Detector 70 is typically a visual display device such as an oscilloscope.

It is worthwhile to note that, although coupler 20 launches pulses bidirectionally along pairs 16, asymmetry in detection is achieved by connecting coupler 50, via filter 90 and detector 70, to shield 15 (rather than shield 17). With this connection arrangement, shield faults in the two-wire circuit having pair grouping 16 as one wire and shield 15 as the other are amenable for testing.

Figure 3:
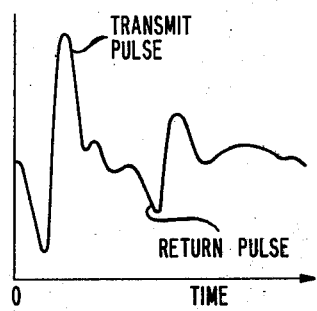
FIG. 3 shows the transmitted and reflected signals as displayed by detector 70 of FIG. 1 for a cable having an open shield at the opposite end of the cable.

As one example of the capability of the testing arrangement of FIG. 1, FIG. 3 shows the transmitted and reflected signals, as displayed by an oscilloscope comprising detector 70, for a cable having an open shield at the opposite end of the cable. The test pulse produced by source 10 is one-half of a sine wave having a period of 2 microseconds. One of the effects of filter 90 upon detection is the differentiation of the test pulse and subsequent return signals. The distance to the fault is proportional to the time between transmitted and received signals and the velocity of propagation along a cable structure.

Figure 4:
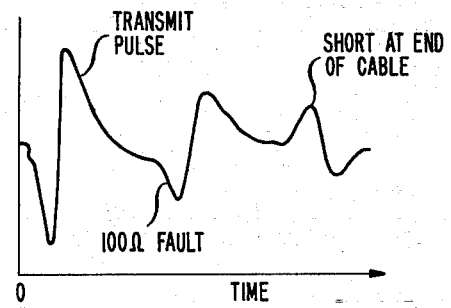
FIG. 4 shows the transmitted and reflected signals as displayed by detector 70 of FIG. 1 for a cable route having: a 100-ohm resistance produced by a faulty bond at the juncture of two substantially equal length cables; and a short between at least one wire pair and the shield at the far end of the cable route.

A second example is depicted in FIG. 4, which shows the display resulting from testing a cable route having: a 100-ohm resistance bond at the juncture of two substantially equal length cables; and a short between at least one wire pair and the shield at the far end of the cable route. The pulse returned from the short is inverted with respect to the transmitted pulse because the reflection coefficient of a short is phase-reversed from that of an open.

Detector 70 may, in contrast to a visual display, comprise a threshold device which provides an indication of distance to a fault for returned signals greater than a predetermined threshold.

It will be further understood that the capacitive-inductive testing arrangement herein described is not limited to specific forms disclosed by way of illustration, but may assume other embodiments limited only by the scope of the appended claims.

I claim:

1. Apparatus for detecting an open shield or bond along a cable route from a test location wherein each cable comprising the route has a multiplicity of wires surrounded by a conductive sheath, the shield formed by bonding the individual sheaths of juxtaposed cables, said apparatus

CHARACTERIZED BY a capacitive coupler adapted for encompassing a plurality of said wires at said test location while maintaining the electrical and mechanical integrity of said wires, a detector, connected between said coupler and said shield, for sensing signals propagated along a transmission line having said plurality as one conductor and said shield as the other conductor of said line, said plurality, said coupler, said detector and the input impedance of said transmission line forming a series electrical path, a high-frequency, time-limited source, and a drive transformer, collocated with said coupler, comprising a split core for encircling said plurality and thereby magnetically coupling to said path, and a drive winding connected to said source, wherein said detector provides an indication of the relative time displacement between the signal coupled to said line by said source and the return signal propagated along said line by reflection from said open.

2. Apparatus as recited in claim 1 wherein said coupler comprises a hinged, cylindrically-shaped member for encircling said plurality, said source is a pulse generator, and said detector includes a high-pass filter.

3. A method for detecting an open shield or bond along a cable route from a test location using a pulse source and a detector and wherein each cable comprising the route has a multiplicity of wires surrounded by a conductive sheath, the shield formed by bonding the individual sheaths of juxtaposed cables, said method CHARACTERIZED BY the steps of encompassing a plurality of said wires at said test location with a capacitive coupler while maintaining the electrical and mechanical integrity of said wires, connecting said coupler to said detector and said detector to said shield and, thereby, forming a series electrical path comprising said plurality, said coupler, said detector and the input impedance of a transmission line having said plurality as one conductor and said shield as the other conductor, encircling said plurality with a split-core transformer collocated with said coupler so that said path comprises the secondary of said transformer, providing said transformer with a primary winding connected to said source, sensing signals propagated along said transmission line by detecting current in said path with said detector, and indicating, on said detector, the relative time displacement between the signal coupled to said line by said source and the return signal propagated along said line by reflection from said open.

* * * * *